United States Patent [19]

Blum et al.

[11] 4,451,503

[45] May 29, 1984

[54] PHOTO DEPOSITION OF METALS WITH FAR UV RADIATION

[75] Inventors: Samuel E. Blum, White Plains; Karen H. Brown, Yorktown Heights; Rangaswamy Srinivasan, Ossining, all of N.Y.

[73] Assignee: International Business Machines Corporation, Armonk, N.Y.

[21] Appl. No.: 393,998

[22] Filed: Jun. 30, 1982

[51] Int. Cl.³ ............................................... B05D 3/06
[52] U.S. Cl. .................................. 427/53.1; 427/54.1; 427/252; 204/157.1 R
[58] Field of Search .................... 427/54.1, 53.1, 252, 427/86; 204/157.1 R, 157.1 H

[56] References Cited

U.S. PATENT DOCUMENTS 3,253,946  5/1966  Kozikowski et al. ............... 427/252
4,324,854  4/1982  Beauchamp et al. ............... 427/53.1
4,340,617  7/1982  Deutsch et al. .................... 118/50.1

Primary Examiner—John H. Newsome
Attorney, Agent, or Firm—Jackson E. Stanland

[57] ABSTRACT

A method for depositing a refractory metal onto a substrate wherein a carbonyl compound vapor of the metal in the vicinity of or on the substrate is photodecomposed by ultraviolet radiation of wavelengths less than 200 nm. This causes the release of atoms of the metal, which then condense onto the substrate. In an example, a tungsten layer is photodeposited by this method onto a GaAs semiconductor layer to form a Schottky barrier diode.

16 Claims, 2 Drawing Figures

PHOTO DEPOSITION OF METALS WITH FAR UV RADIATION

DESCRIPTION

1. Field of the Invention

This invention relates to photodeposition of refractory metals onto substrates, and more particularly to such a process where ultraviolet radiation of wavelengths less than 200 nm are used to photodecompose a gaseous metal carbonyl compound in the vicinity of a substrate to deposit a continuous layer of metal onto the substrate.

2. Background Art

Photodeposition of metal films is known in the art, as can be seen by referring to T. F. Deutsch et al., Appl. Phys. Lett., 35, 2, page 175, July 15, 1979 and R. Solanki et al., Appl. Phys. Lett., 38, 7, page 572, Apr. 1, 1981. In this process, light impinges upon a gaseous metal compound and causes dissociation of the compound in the vicinity of the substrate. Molecular bonds in the compound are broken by the light photons and free metal atoms are produced. These metal atoms then condense on the nearby substrate to produce the metallic deposit.

In the T. F. Deutsch et al. article, organometallic compounds, and specifically metal alkyl compounds, where photo dissociated with ultraviolet radiation having wavelengths 193 nm and 257 nm. Metals such as Al, Sn, and Cd were deposited. Iodine was also deposited from $CF_3I$.

In the Solanki et al. reference, refractory metals such as Cr, Mo, and W were deposited using laser-induced gas phase photolysis of hexacarbonyl compounds of these metals. A laser providing ultraviolet wavelengths in the range 260–270 nm was used, the laser output being chosen to be that where the carbonyl molecules strongly absorb radiation. Clusters of metal crystallites were formed on a substrate when the laser beam was focussed, while threads of metal crystallites were formed when the laser beam was defocussed.

The prior art does not recognize the superior results which can be obtained with lower wavelength ultraviolet radiation and carbonyl compounds. In particular, the Solanki et al. reference teaches the use of longer wavelength ultraviolet light with hexacarbonyl compounds for the deposition of refractory metals. At longer wavelengths, the carbonyls do not photodecompose to metal, a heat effect also being required to decompose the hexacarbonyls to free metal atoms. Further, the prior art does not recognize that wavelengths less than 200 nm can be used with carbonyls to give superior metal deposition.

The use of wavelengths less than 200 nm is also advantageous in that focussed ultraviolet beams are not required. This means that heat buildup at the substrate can be avoided.

The chemistry of photodecomposition of different compound groups is different, and predictions cannot be readily made from the results obtained by experiments on any given class of compounds. While the prior art uses long wavelengths with hexacarbonyl compounds for the deposition of refractory metals, applicants have discovered that wavelengths much shorter can be used and will give superior results without requiring any type of pyrolysis effect for the decomposition of the hexacarbonyl.

Accordingly, it is a primary object of the present invention to provide an improved technique for the deposition of refractory metals by photodissociation of a gaseous compound.

It is another object of this invention to provide an improved technique for photodeposition of refractory metals which does not require the use of a focussed beam of radiation.

It is another object of the present invention to provide a technique for metallizing any type of substrate at low temperatures, using ultraviolet radiation of wavelengths less than 200 nm.

It is another object of the present invention to provide an improved technique for photodeposition of refractory metals onto any type of substrate, without causing heat buildup at the substrate.

In the fabrication of semiconductor devices, it is often necessary to deposit metal layers on the semiconductor surface, for current carrying conductors, contacts, gate electrodes, etc. For example, GaAs is a semiconductor material which has properties that are advantageous with respect to the properties of other semiconductor materials, such as silicon. For example, GaAs has higher mobility than Si, and less resistance. However, GaAs is not easily oxidized or metallized, which is a disadvantage to its employment in a variety of device structures. For example, tungsten gate electrodes have been applied to GaAs MESFETs by sputtering and e-beam evaporation. In both of these processes, damage occurs to the GaAs surface. Sputtering causes impact damage, and e-beam evaporation results in dissociation of GaAs.

Thus, it is another object of this invention to provide a process for making metallic contacts and gates on GaAs surfaces, without damaging the surfaces.

It is another object of the present invention to provide a Schottky barrier between a tungsten layer and GaAs in a manner in which a good barrier is created without damaging the GaAs.

The present invention is also useful in the fabrication of other devices where surface damage may be caused by metal deposition techniques such as evaporation and sputtering. For example, solar cells often use tungsten contacts, but surface damage has to be avoided.

Therefore, it is another object of this invention to provide an improved technique for providing tungsten contacts to solar cells and other devices in which the surface of the device cannot be damaged by the tungsten layer.

DISCLOSURE OF THE INVENTION

This invention is a process for photodeposition of a refractory metal from a gaseous carbonyl compound including the refractory metal. Photodeposition occurs when ultraviolet radiation of wavelengths less than 200 nm strikes the gaseous carbonyl compounds in the vicinity of the subtrate. Continuous layers of metal are deposited on the substrate in those regions adjacent to where the ultraviolet radiation strikes the carbonyl compounds.

The substrate can be any type of material, including but not restricted to quartz, glass, semiconductors such as Si and GaAs, polymers, and metals. In a particularly important embodiment, layers of tungsten are photodeposited onto GaAs.

These and other objects, features, and advantages will be apparent from the following more particular description of the preferred embodiments.

BEST MODE FOR CARRYING OUT THE INVENTION

Figure 1:
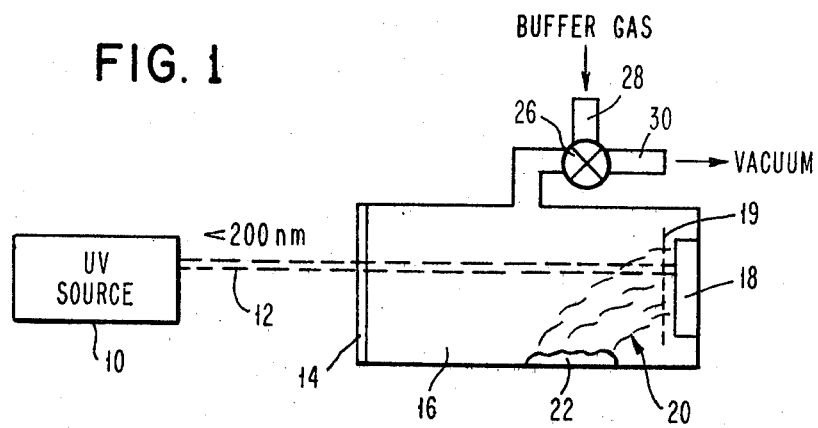
FIG. 1 is a schematic illustration of an apparatus which can be used to practice the photodeposition process of this invention.

FIG. 1 shows a suitable apparatus for carrying out the process of the present invention. In this apparatus, an ultraviolet light source 10 provides an output beam of radiation 12 having wavelengths less than 200 nm. Beam 12 passes through a fused silica window 14 of the chamber 16, and travels to the vicinity of the substrate 18, in front of which is a mask 19. Located inside chamber 16 is a source of refractory metal carbonyl vapors 20, the source being, for example, metal carbonyl powder 22. Chamber 16 is also provided with an input/output port 24, in which a valve 26 is located. A buffer gas, such as helium, can be introduced into chamber 16 via inlet 28, while a vacuum can be produced in chamber 16 by exhausting the atmosphere therein through outlet pipe 30.

Source 10 provides ultraviolet radiation having wavelengths less than 200 nm, and can be a source providing pulsed outputs or continuous wave outputs. An example of a pulsed output source is an ArF excimer laser which will produce output pulses of approximately 10 nsec width at 193 nm. A continuous wave source suitable for the present invention is a low pressure mercury vapor lamp providing a continuous output at 185 nm. Both of these sources are commercially available.

The input ultraviolet radiation beam 12 passes through window 14 and strikes the vapors 20 inside reaction chamber 16. Molecular bonds of the vapor near and/or adsorbed on substrate 18 are broken by the photons in the ultraviolet radiation and produce free metal atoms. The atoms in the vicinity of substrate 18 condense on the substrate. The particular pattern of metal deposited on substrate 18 is defined by the radiation beam 12. By scanning beam 12, deposition can be made to occur on different portions of substrate 18. In order to produce very fine lines of deposition, beam 12 is often collimated and focussed by optical apparatus, including focussing lenses. Of course, the light beam 12 can also be patterned by projection through a mask, such as mask 19 in FIG. 1.

In operation, a metal carbonyl compound in the form of a powder 22 is placed on the bottom of the reaction chamber 16. Chamber 16 is then pumped down by a pump (not shown). Chamber 16 can be back filled with a buffer gas, such as He, in order to reduce the mean free path of the free metal atoms. This confines the metal photofragments to the small regions immediately surrounding the volume of input beam 12.

A heater (not shown) can also be provided to heat reaction chamber 16, and specifically powder 22, in order to increase the metal carbonyl vapor pressure in chamber 16. The temperature in the reaction chamber is kept below a temperature where thermodecomposition of the metal carbonyl vapors would occur.

The gas pressures within reaction chamber 16 are not critical, and can range from pressures less than $10^{-5}$ Torr to about 3 Torr of the refractory metal carbonyl vapor and about 750 Torr He. The exposure times of the carbonyl vapors to the ultraviolet beam 12 can typically range from less than 1 second to several seconds or minutes. The exposure time depends upon the density of the metal carbonyl vapor and the required thickness of the metal deposit.

The use of a laser beam allows ready spatial localization of the reaction region, and may be focussed to provide high resolution patterns on the substrate. Because the metal carbonyl vapor has a very high absorption for light at the specified wavelength range, there is very little, if any, heating of the substrate. Also, the deposited film does not ablate due to the light beam. Since a mask 19 can be used, the light beam need not be focussed, and therefore adverse heating of the substrate or deposited metal can be avoided.

The light source 10 can be either a continuous wave source or a pulsed source, as noted previously. For some applications, such as those requiring large area depositions (for example, projection printing of a mask), pulsed sources may be more appropriate, due to the average powers which can be obtained with them.

For direct writing applications, a scanned focussed cw laser may be more appropriate. Use of a buffer gas in the reaction chamber 16 helps to confine the mean free path of the metal atoms, and therefore provides more localized deposition. However, the addition of the buffer gas may sometimes affect the deposition rate. The pressures of the metal carbonyl vapors and the buffer gas are not critical, nor is the temperature within the reaction chamber 16 and at the substrate 18. Room temperatures are suitable.

Figure 2:
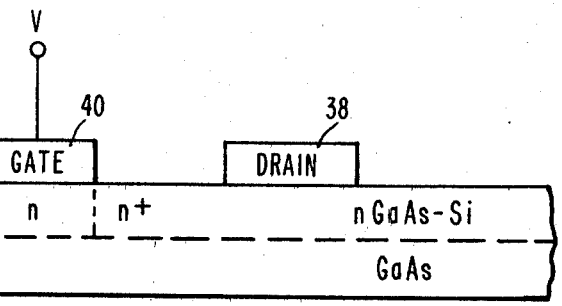
FIG. 2 is a side view of a MESFET device in which a gate electrode is photodeposited onto a semiconductor material using the present invention.

FIG. 2 shows a GaAs MESFET (metal electrode semiconductor field effect device) which is comprised of a layer 32 of semi-insulating GaAs, a layer 34 of n-type GaAs-Si, source and drain electrodes 36, 38 respectively, and a metal gate electrode 40. Gate electrode 40 is tungsten, which makes a Schottky barrier diode where it contacts the underlying semiconductor layer 34. In the operation of this device, current flows from the source 36 to the drain 38 in accordance with the applied voltage V at the gate electrode 40.

The preferred gate electrode material is tungsten because it has a high Schottky barrier with semiconductor layer 34, and because it will not alloy with GaAs in the high temperature (800°-900° C.) process typically used in fabrication. Other metals, such as Au, Al, etc. will alloy with GaAs and produce ohmic contacts rather than diode barriers. Tungsten also has another desirable characteristic because it functions as a mask when the n+ regions are prepared by diffusion.

The tungsten gate electrode 40 can be deposited by the method of the present invention. This will not cause any type of damage to semiconductor layer 34 and can be done at a low temperature ($<30°$ C.) because wavelengths less than 200 nm photodecompose the tungsten hexacarbonyl W(CO)$_6$. This hexacarbonyl decomposes with ultraviolet radiation at an electronically excited state, rather than a thermally activated or ionized state. The specific process steps for the fabrication of the device in FIG. 2 are the following:

1. In a body of GaAs semiconductor material, Si is implanted or diffused to form n-type surface layer 34. The structure is then annealed at approximately 850° C.
2. A layer 40 of tungsten is then formed by photodecomposition of tungsten hexacarbonyl in the reaction chamber of FIG. 1. This forms a Schottky diode between metal 40 and underlying semiconductor layer 34.
3. Additional Si is implanted or diffused into layer 34 to form the n+ regions.
4. The resulting structure is annealed at 800°–900° C.
5. The structure is then masked and ohmic contacts 36 and 38 are formed for the source and drain electrodes.

As an additional example, tungsten was deposited on a high resistivity GaAs wafer in the reaction chamber 16. Tungsten hexacarbonyl powder was used to provide the tungsten hexacarbonyl vapors in the vicinity of the GaAs wafer substrate. The light source was an ArF excimer laser providing ultraviolet light at 193 nm. This laser produced pulses of radiation of approximately 12 nsec duration. An exposure of 200 pulses, where each pulse was 27 mV, was made to deposit a tungsten layer by photodeposition. The pressure in the reaction chamber was ~1 Torr, and the temperature was ambient room temperature. A metallic tungsten deposit having the size and shape of the ultraviolet beam was formed, the deposit being 800 Å thick. It was a continuous film providing good electrical conduction. Mo and Cr continuous films were also photodeposited by the method of this invention. The conditions used for those depositions were essentially identical to those used for the tungsten deposition.

In the practice of this invention, photodeposition of refractory metals onto a substrate is achieved by combining ultraviolet excitation of carbonyl vapors of these refractory metals, using wavelengths less than 200 nm. While those of skill in the art may recognize variations that can be made in the subject process, these variations will be consistent with the principles therefor herein where carbonyl vapors are used in combination with short wavelength ultraviolet radiation in the specified range, in order to produce superior results.

Having thus described our invention, what we claim as new and desire to secure by Letters Patent is:

1. A method for photodeposition of a refractory metal onto a substrate, comprising the steps of:
   producing a carbonyl compound vapor of said metal in the vicinity of said substrate,
   directing ultraviolet light of wavelengths less than 200 nm onto said vapor to photodecompose said vapor to release atoms of said metal in the vicinity of or on said substrate, and
   condensing said metal atoms onto said substrate to form a continuous refractory metal layer thereon.
2. The method of claim 1, where said photodeposition occurs at substantially room temperatures.
3. The method of claim 1, where said refractory metals are chosen from the group consisting of Mo, W, and Cr.
4. The method of claim 1, where said substrate is selected from the group consisting of semiconductors, polymers, insulators, and metals.
5. The method of claim 1, where said refractory metal is W, and said substrate is GaAs.
6. The method of claim 1, where said ultraviolet light is produced by an ArF excimer laser at a wavelength of 193 nm.
7. The method of claim 1, where said ultraviolet light is produced by a low pressure Hg lamp at a wavelength of 185 nm.
8. The method of claim 1, where said ultraviolet radiation is applied as a continuous wave or as a pulse.
9. The method of claim 1, where said carbonyl compound vapor is mixed with a buffer gas in the vicinity of said substrate.
10. The method of claim 1, where said ultraviolet light is focussed and scanned across said substrate.
11. The method of claim 1, where said ultraviolet light is directed through a mask before striking said substrate.
12. A method for forming a GaAs Mesfet, comprising the steps of:
    introducing an impurity into a body of GaAs to form a doped layer therein,
    photodepositing a layer of tungsten onto said doped layer to form a gate electrode by photodecomposing a carbonyl compound vapor of tungsten with ultraviolet light of wavelengths less than 200 nm in the vicinity of or on said doped layer to free tungsten atoms which then condense onto said doped layer in a first region thereof defined by said ultraviolet radiation,
    forming additional more highly doped regions in said doped layer surrounding said first region, and
    forming source and drain contacts to said additionally doped regions.
13. The method of claim 12, where said carbonyl compound is a hexacarbonyl of tungsten.
14. A method for depositing a refractory metal onto selected areas of a substrate, comprising the steps of:
    locating said substrates in a reaction chamber, producing carbonyl compound vapors of said refractory metal in said reaction chamber in the vicinity of said substrates,
    directing ultraviolet light of wavelengths less then 200 nm into said reaction chamber and through a mask to photodecompose said vapor to release atoms of said refractory metal in the vicinity of or on said substrate, said atoms being released in locations defined by said ultraviolet light,
    condensing said refractory metal atoms onto said substrate in said selected locations determined by said ultraviolet light to form a continuous layer of said refractory metal.
15. The method of claim 14, where said refractory metals are selected from the group consisting of Mo, W, and Cr.
16. The method of claim 15, where said ultraviolet light is focussed.

* * * * *